(12) United States Patent
Nejad et al.

(10) Patent No.: US 7,214,621 B2
(45) Date of Patent: May 8, 2007

(54) METHODS OF FORMING DEVICES ASSOCIATED WITH SEMICONDUCTOR CONSTRUCTIONS

(75) Inventors: Hasan Nejad, Boise, ID (US); Gordon A. Haller, Boise, ID (US); Thomas Arthur Figura, Boise, ID (US); Ravi Iyer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 10 days.

(21) Appl. No.: 11/131,994

(22) Filed: May 18, 2005

(65) Prior Publication Data

US 2006/0263979 A1   Nov. 23, 2006

(51) Int. Cl.
*H01L 21/8244* (2006.01)

(52) U.S. Cl. .................. 438/682; 438/256; 438/242; 438/630; 438/637; 438/642; 438/649; 438/655; 438/721; 439/917

(58) Field of Classification Search .......... 438/256, 438/542, 630, 637, 642, 649, 655, 664, 682, 438/721, 917, FOR. 405
See application file for complete search history.

(56) References Cited

U.S. PATENT DOCUMENTS

| 2003/0011032 | A1 | 1/2003 | Umebayashi | |
|---|---|---|---|---|
| 2004/0092070 | A1* | 5/2004 | Hsu et al. | 438/241 |
| 2004/0108527 | A1* | 6/2004 | Taniguchi et al. | 257/213 |
| 2005/0014338 | A1 | 1/2005 | Kim et al. | |
| 2005/0042822 | A1* | 2/2005 | Yoshida et al. | 438/253 |
| 2005/0151180 | A1* | 7/2005 | Chiang | 257/298 |
| 2006/0046398 | A1* | 3/2006 | MdDaniel et al. | 438/279 |

* cited by examiner

*Primary Examiner*—George R. Fourson
*Assistant Examiner*—Joannie Adelle Garcia
(74) *Attorney, Agent, or Firm*—Wells St. John P.S.

(57) ABSTRACT

The invention includes methods of forming devices associated with semiconductor constructions. In exemplary methods, common processing steps are utilized to form fully silicided recessed array access gates and partially silicided periphery transistor gates.

29 Claims, 10 Drawing Sheets

METHODS OF FORMING DEVICES ASSOCIATED WITH SEMICONDUCTOR CONSTRUCTIONS

TECHNICAL FIELD

The invention pertains to methods of forming devices associated with semiconductor constructions, and in particular aspects pertains to methods of forming recessed access devices (generally, metal-oxide-semiconductor field effect transistor, MOSFET, devices).

BACKGROUND OF THE INVENTION

A semiconductor transistor device is a device comprising a gate which interconnects a pair of source/drain regions with one another through a channel controlled by the gate. Transistor devices are common circuit devices of semiconductor constructions. For instance transistor devices can be incorporated into memory structures, including, for example, dynamic random access memory (DRAM) and static random access memory (SRAM).

A continuing goal in semiconductor fabrication is to increase a level of integration, and thus decrease the amount of semiconductor real-estate consumed by devices. Decreasing the size of transistor devices, however, leads to numerous difficulties. For instance, as the channel-length of a transistor device is decreased, numerous problems occur in attempting to control electron flow between source/drain regions on opposing sides of the channel. These problems are generically referred to as short-channel effects.

One approach that may have utility for overcoming short-channel problems is to recess transistor devices within a substrate so that the devices consume less real-estate than if they were non-recessed, and yet have relatively long channels. A non-recessed (i.e., planar) transistor device is shown in FIG. 1, and a recessed device is shown in FIG. 2 for comparison to the non-recessed device.

Figure 1:
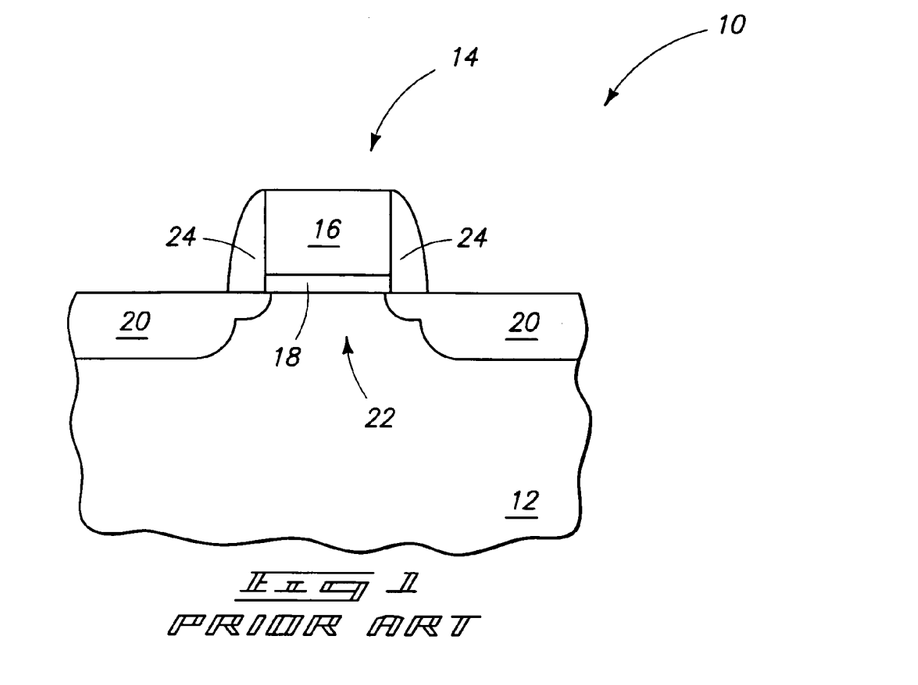
FIG. 1 is a diagrammatic, cross-sectional view of a prior art transistor device.
Figure 2:
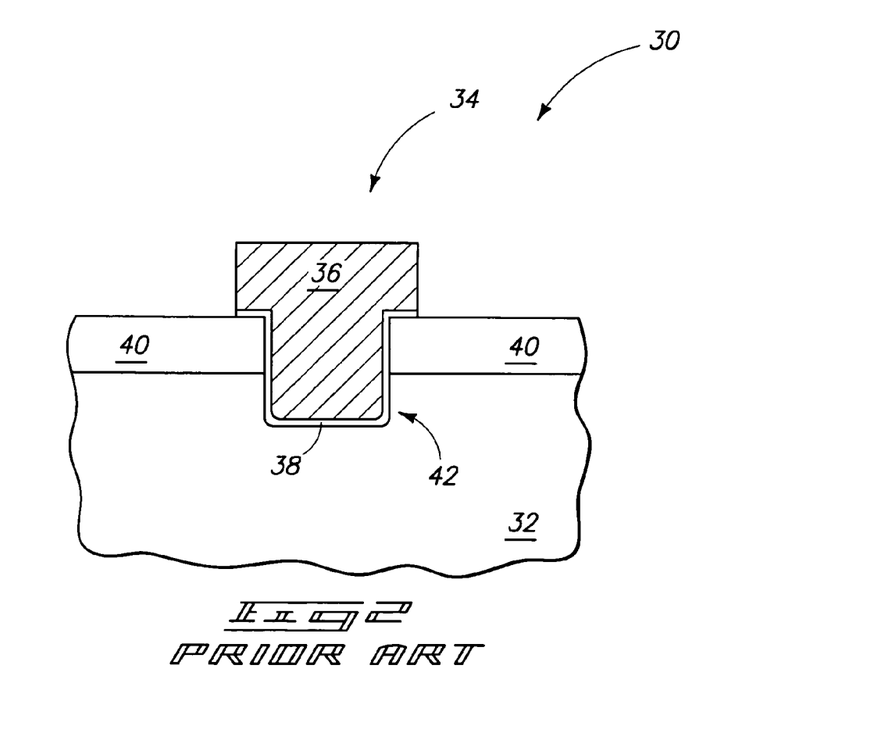
FIG. 2 is a diagrammatic, cross-sectional view of another prior art transistor device.

Referring initially to FIG. 1, a semiconductor construction 10 is illustrated to comprise a substrate 12. The substrate 12 can comprise, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A transistor device 14 is supported by the substrate. The transistor device includes a gate 16 spaced from substrate 12 by a dielectric material 18; includes sidewall spacers 24 along sidewalls of the gate; includes a pair of source/drain regions 20 on opposing sides of the gate; and includes a channel region 22 between the source/drain regions.

The gate 16 can comprise various electrically conductive materials, including, for example, various metals, metal compositions, and/or conductively-doped silicon or other conductively-doped semiconductor material. Dielectric material 18 can comprise any suitable material or combination of materials, and typically will comprise, consist essentially of, or consist of silicon dioxide. Sidewall spacers 24 can comprise any suitable compositions or combination of compositions, and typically will comprise one or both of silicon nitride and silicon dioxide. Source/drain regions 20 can comprise conductively-doped regions within monocrystalline substrate 12, and can comprise heavily-doped regions with lightly-doped extensions. For instance, the source/drain regions 20 can comprise either heavily n-type doped regions or heavily p-type doped regions, and can comprise lightly-doped portions extending under sidewalls 24. Channel region 22 is doped with a threshold voltage implant, and operably interconnects the source/drain regions 20 with one another when sufficient current passes through gate 16.

FIG. 2 shows a construction 30 comprising a semiconductor substrate 32 and a transistor 34 supported by the substrate. The transistor comprises a gate 36 extending within the substrate, a dielectric material 38 between the gate and the substrate, source/drain regions 40 within the substrate proximate the gate, and a channel region 42 extending around a lowermost portion of the gate and interconnecting the source/drain regions 40 with one another. Although not shown, sidewall spacers can be provided proximate gate 36 similar to the spacers 24 discussed above with reference to FIG. 1.

The substrate 32, dielectric material 38, gate 36 and source/drain regions 40 can comprise identical materials to those discussed above regarding the substrate 12, gate 16, dielectric material 18 and source/drain regions 20 of FIG. 1. Also, a threshold voltage implant can be provided within channel region 42 similar to the threshold voltage implant provided within region 22 of FIG. 1.

A difference between the recessed device construction of FIG. 2 relative to the non-recessed device construction of FIG. 1 is that the channel region 42 of the device of FIG. 2 is lengthened by virtue of the channel region extending around a recessed portion of the gate 36. Such can reduce short-channel effects for the transistor device 34 of FIG. 2 relative to the device 14 of FIG. 1.

Although recessed access devices have advantages relative to non-recessed devices in terms of the packing density that can be achieved while avoiding short-channel effects, there are various problems encountered in large-scale fabrication of recessed access devices which are to be addressed if recessed access devices are to become commercially feasible. Accordingly, it is desired to develop new methodology for large-scale fabrication of recessed access devices. One application for recessed access devices is in memory arrays, such as, for example, DRAM arrays. Accordingly, it would be further desirable if methodologies developed for large-scale fabrication of recessed access devices were applicable to fabrication of memory arrays.

SUMMARY OF THE INVENTION

In one aspect, the invention includes a method of forming devices associated with a semiconductor construction. A semiconductor substrate is provided. The substrate has a memory array region and a peripheral region proximate the memory array region. The substrate has recessed access device trenches within the memory array region, and has gate line corridors within the peripheral region. Silicon-containing material is formed within the recessed access device trenches and within the gate line corridors. Some of the silicon-containing material within the gate line corridors is converted to a metal silicide simultaneously with conversion of at least some of the silicon-containing material within the recessed access device trenches to metal silicide. The gate line corridors can be utilized for formation of planar MOSFET devices. In some aspects, the gate line corridors can be referred to as interconnect line corridors to indicate that the corridors can be utilized for forming any interconnect line, including, but not limited to, gate lines.

In one aspect, the invention encompasses another method of forming devices associated with a semiconductor construction. A semiconductor substrate is provided. The substrate has a memory array region and a peripheral region proximate the memory array region. The substrate has recessed access device trenches within the memory array region, and has gate line corridors within the peripheral region. Silicon-containing material is formed within the recessed access device trenches and within the gate line corridors. The silicon-containing material within the gate line corridors and recessed access device trenches is defined to be first and second portions of the silicon-containing material, respectively. A first metal-containing layer is formed over the first and second portions of the silicon-containing material. Metal from the first metal-containing layer is utilized to convert upper regions of the first and second portions of the silicon-containing material to first and second portions of a first metal silicide, respectively. The converted upper regions of the first and second portions of the silicon-containing material are over non-converted lower regions of the first and second portions of the silicon-containing material. A barrier layer is formed over the first portion of the first metal silicide. A second metal-containing layer is formed over the barrier layer and over the second portion of the first metal silicide. Metal from the second metal-containing layer is utilized to convert at least some of the lower region of the second portion of the silicon-containing material to a second metal silicide.

In one aspect, the invention encompasses yet another method of forming devices associated with a semiconductor construction. A semiconductor substrate is provided. The substrate has a memory array region and a peripheral region proximate the memory array region. The substrate has recessed access device trenches within the memory array region, and has gate line corridors within the peripheral region. Silicon-containing material is formed within the recessed access device trenches and within the gate line corridors. A metal-containing layer is formed over the silicon-containing material. The metal-containing layer has a first portion directly over the recessed access device trenches, and has a second portion directly over the gate line corridors. The first portion of the metal-containing layer is substantially thicker than the second portion of the metal-containing layer. Metal from the metal-containing layer is utilized to convert part of the silicon-containing material within the gate line corridors to metal silicide, and to convert silicon-containing material within the recessed access device trenches to metal silicide.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes processes for forming fully silicided metal gates in recessed access devices. The fully silicided metal gates can be utilized in, for example, 4.5 $F^2$ cell designs. Semiconductor constructions will frequently have some fully silicided metal gates formed thereover, and some partially silicided gates. For instance, the fully silicided metal gates can be utilized in recessed access devices within a memory array, and the partially silicided gates can be utilized in transistor constructions peripheral to the memory array. The invention can include processing in which one or more steps utilized for formation of fully silicided recessed gates are conducted simultaneously with steps utilized to form partially silicided planar transistor gates.

Figure 3:
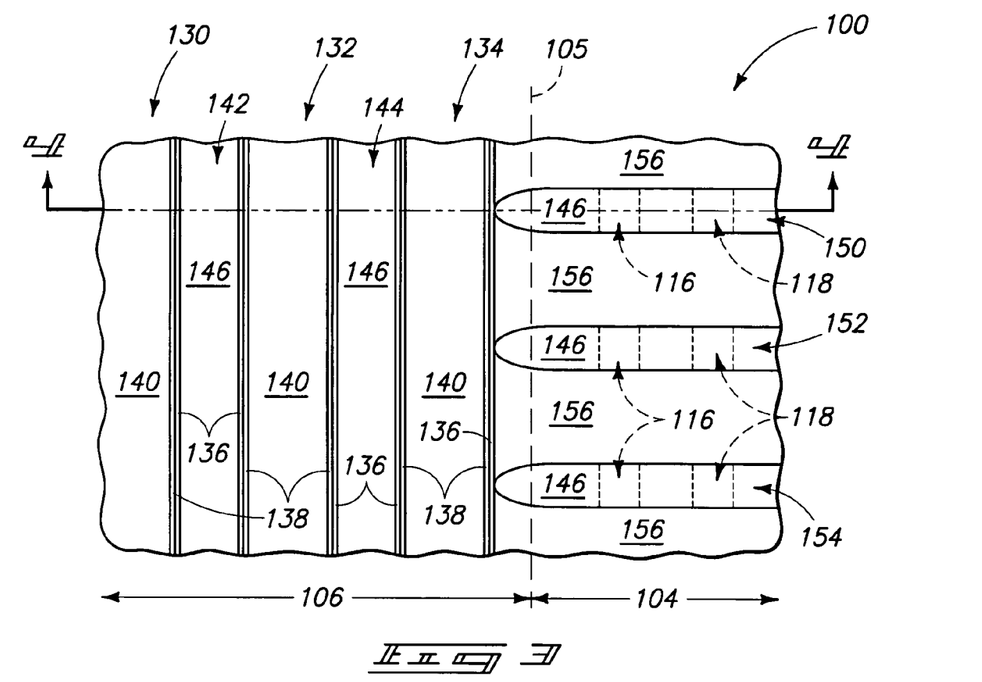
FIGS. 3 and 4 are a diagrammatic top view and cross-sectional view, respectively, of a semiconductor wafer fragment at a preliminary processing stage of an exemplary aspect of the present invention. The cross-section of FIG. 4 is along the line 4—4 of FIG. 3.
Figure 4:
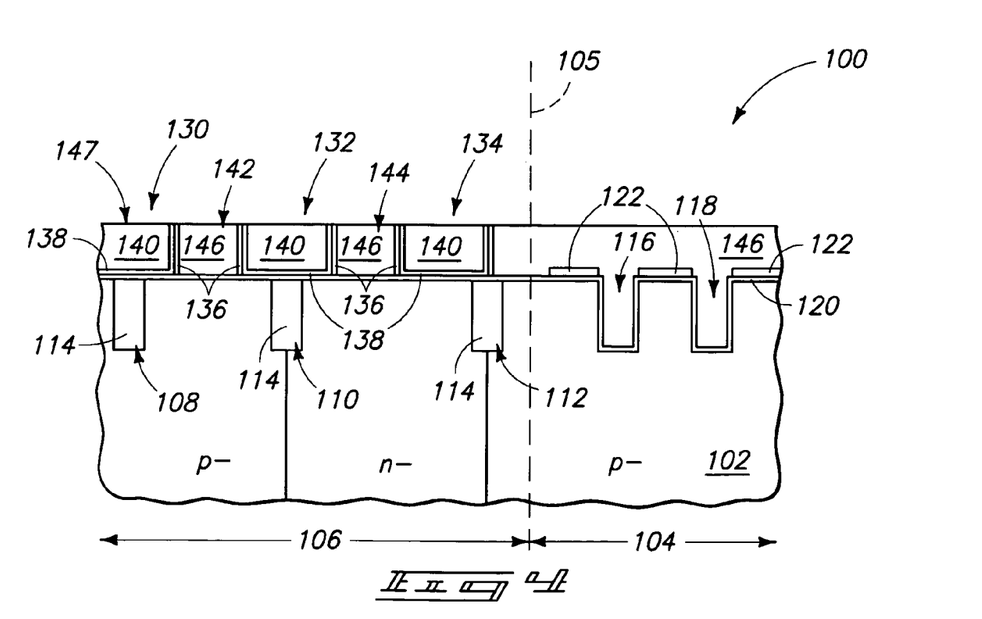

Exemplary aspects of the invention are described with reference to FIGS. 3–19. Referring initially to FIGS. 3 and 4, a semiconductor construction 100 is illustrated at a preliminary processing stage. The construction 100 comprises a semiconductor substrate 102. In exemplary aspects, substrate 102 can comprise, consist essentially of, or consist of appropriately-doped monocrystalline silicon (i.e., bulk silicon).

A memory array region 104 of the substrate is defined, and a region 106 peripheral to the memory array region is also defined, (region 106 can be referred to as a peripheral region). The memory array region and peripheral region are diagrammatically illustrated as being separated by a boundary 105. The boundary is shown to illustrate an exemplary location of a defined interface between a memory array region and a peripheral region, but persons of ordinary skill in the art will recognize that a boundary between the memory array region and peripheral region may be defined to be in another location instead of where boundary 105 is illustrated in the drawings.

A plurality of isolation regions 108, 110 and 112 extend into substrate 102 within the peripheral region 106. The isolation regions can correspond to, for example, shallow trench isolation regions. The isolation regions are shown filled with material 114. Such material can be any suitable material, including, for example, a material comprising, consisting essentially of, or consisting of silicon dioxide.

The substrate 102 is shown to be doped to have a pair of p-regions separated from one another by an n-region. One of the p-regions is within peripheral region 106 and the other is within memory array region 104, and the n-region is within peripheral region 106. In particular aspects, substrate 102 can be initially provided to be doped to p-, and the n-region can be formed by counter-doping the substrate to form an n-well extending into the p-substrate.

The combination of a p-region and an adjacent n-region in the peripheral region 106 can form a CMOS (complementary metal oxide semiconductor) region.

The p- and n-regions are shown to illustrate one exemplary aspect of the invention, and it is to be understood that the invention can also utilize substrates which are uniformly doped with either p- or n-regions, rather than with alternating p- and n-regions.

Recessed access device trenches 116 and 118 extend into substrate 102 within memory array region 104. The recessed access device trenches can be a subset of a large plurality of trenches.

Recessed access device trenches 116 and 118 are shown extending to about the same depth as shallow trench isolation regions 108, 110 and 112. Such can be accomplished utilizing common processing to form the trenches of trenched isolation regions 108, 110 and 112 simultaneously with the formation of recessed access device trenches 116 and 118. It is to be understood that the invention encompasses other aspects (not shown) in which the recessed access device trenches are formed to different depths than the trenched isolation regions. Also, it is to be understood that the recessed access device trenches may or may not be formed in a common processing stage with the isolation region trenches.

A layer 120 of electrically insulative material extends across peripheral region 106 and across memory array region 104, with the layer 120 extending into the trenches 116 and 118 to line the trenches. Layer 120 can, for example, comprise, consist essentially of, or consist of silicon dioxide. In such aspects, layer 120 can be formed by thermally oxidizing a surface of a monocrystalline substrate 102. Alternatively, layer 120 can be formed by depositing appropriate materials over the surface of substrate 102.

Thin blocks of dielectric material 122 are provided within memory array region 104 and proximate trenches 116 and 118. Material 122 can, for example, comprise, consist essentially of, or consist of silicon dioxide, and can be provided as a so-called pad oxide to protect upper surfaces adjacent trenches 116 and 118 during subsequent processing. In some aspects, material 122 can be omitted if protection of upper surfaces adjacent the trenches is found to be unnecessary.

A plurality of insulative material blocks 130, 132 and 134 extend over peripheral region 106. The blocks comprise sidewall materials 136, liners 138, and filler material 140. The sidewalls 136 can comprise, consist essentially of, or consist of silicon dioxide; the liners 138 can comprise, consist essentially of, or consist of silicon nitride; and the filler material 140 can comprise, consist essentially of, or consist of silicon dioxide. Blocks 130, 132 and 134 can be formed by any suitable processing, including, for example, forming a layer of material 136 over peripheral region 106, etching openings through the layer to form the patterned sidewalls, and subsequently filling the openings with liner 138 and material 140.

Blocks 130, 132 and 134 are spaced from one another by regions 142 and 144. Such regions correspond to corridors extending along peripheral region 106. Ultimately, gate lines are formed within such corridors, and accordingly the regions 142 and 144 can be referred to as gate line corridors. In some aspects, the gate line corridors can be referred to as interconnect line corridors to indicate that the corridors can be utilized for forming any interconnect line, including, but not limited to, gate lines.

A silicon-containing material 146 is formed within the recessed access device trenches 116 and 118, and also within the gate line corridors 142 and 144. The silicon-containing material is formed directly against layer 120 in the shown aspect of the invention.

Silicon-containing material 146 can comprise, consist essentially of, or consist of one or both of polycrystalline silicon and amorphous silicon. Material 146 can be conductively-doped at the processing stage of FIG. 4, or can be undoped (with the term "undoped" meaning that the material has a dopant level less than that corresponding to conductive-doping, but typically greater than 0; with conductively-doped material typically having a dopant concentration of greater than about $1\times10^{19}$ atoms/cm$^3$, and undoped material having a dopant concentration less than $1\times10^{19}$ atoms/cm$^3$).

Material 146 and blocks 130, 132 and 134 are shown planarized (such as, for example, chemical-mechanical polished) so that the material 146 and blocks 130, 132 and 134 share a substantially planar upper surface 147.

The top view of FIG. 3 shows that the recessed access device trenches are within access device regions 150, 152 and 154 that are spaced from one another by isolation regions 156. The shown access device regions 150, 152 and 154 are substantially elliptical in shape, but it is to be understood that the regions can have any suitable configuration. Trenches 116 and 118 are diagrammatically illustrated in phantom view in regions 150, 152 and 154 to further illustrate the relationship between FIGS. 3 and 4.

Figure 5:
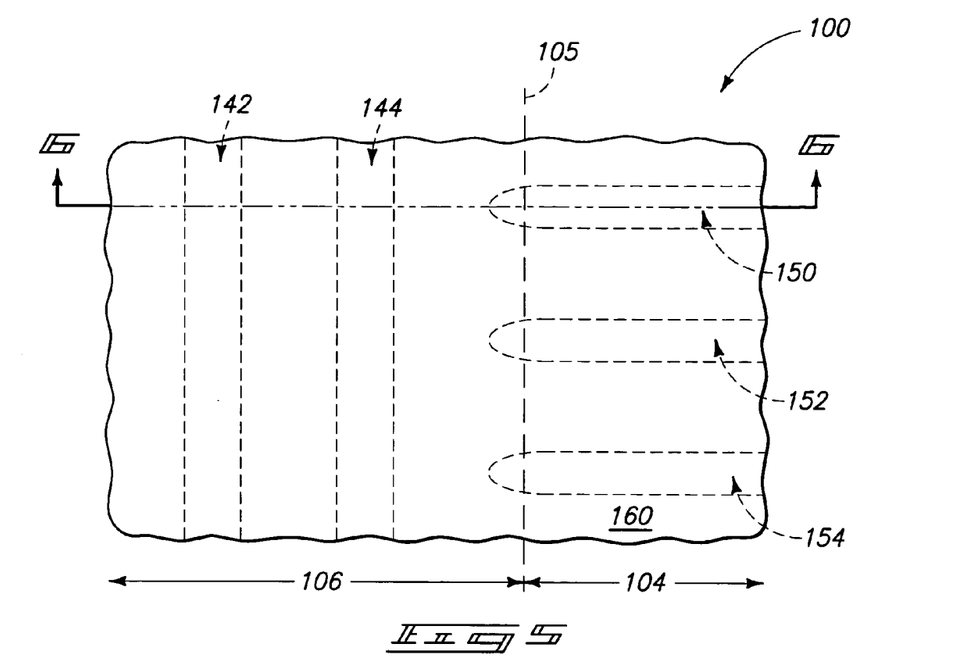
FIGS. 5 and 6 illustrate the fragments of FIGS. 3 and 4, respectively, at a processing stage subsequent to that of FIGS. 3 and 4. The cross-section of FIG. 6 is along the line 6—6 of FIG. 5.
Figure 6:
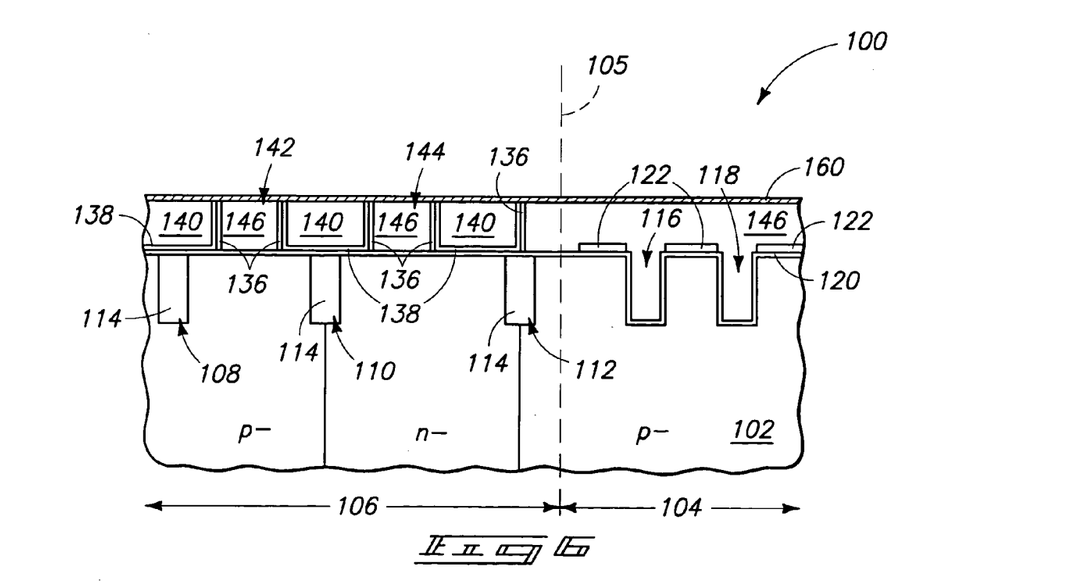

Referring next to FIGS. 5 and 6, a metal-containing layer 160 is formed over gate line corridors 142 and 144, and over access device regions 150, 152 and 154. The corridors 142 and 144, and the access device regions 150, 152 and 154 are shown in phantom view in FIG. 5 to illustrate the relationship between FIGS. 5 and 6. The metal-containing layer is formed directly against silicon-containing material 146, and uppermost surfaces of materials 136, 138 and 140 in the shown aspect of the invention.

The metal-containing layer 160 comprises metal in a form which can be subsequently utilized for silicidation of material 146 beneath the metal-containing layer. Accordingly, the metal-containing layer will typically comprise metal in elemental form. In particular aspects, metal-containing layer 160 can comprise, consist essentially of, or consist of one or both of cobalt and nickel. It is to be understood, however, that the metal utilized in metal-containing layer 160 can be any metal which can ultimately be utilized for forming metal silicide from silicon of layer 146.

Figure 7:
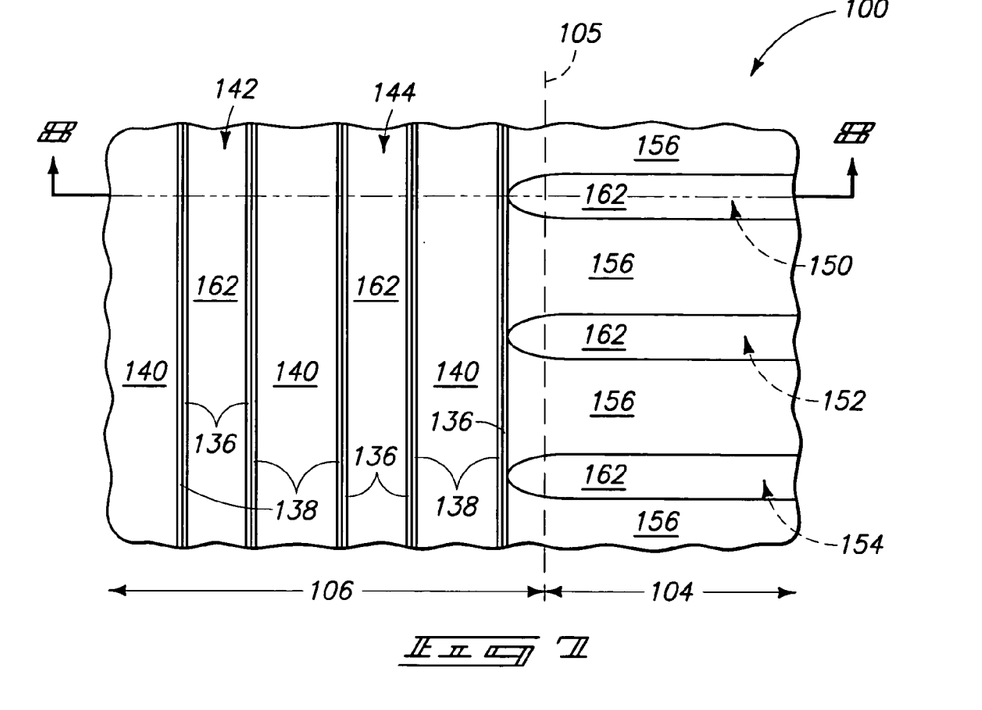
FIGS. 7 and 8 illustrate the fragments of FIGS. 3 and 4, respectively, at a processing stage subsequent to that of FIGS. 5 and 6. The cross-section of FIG. 8 is along the line 8—8 of FIG. 7.
Figure 8:
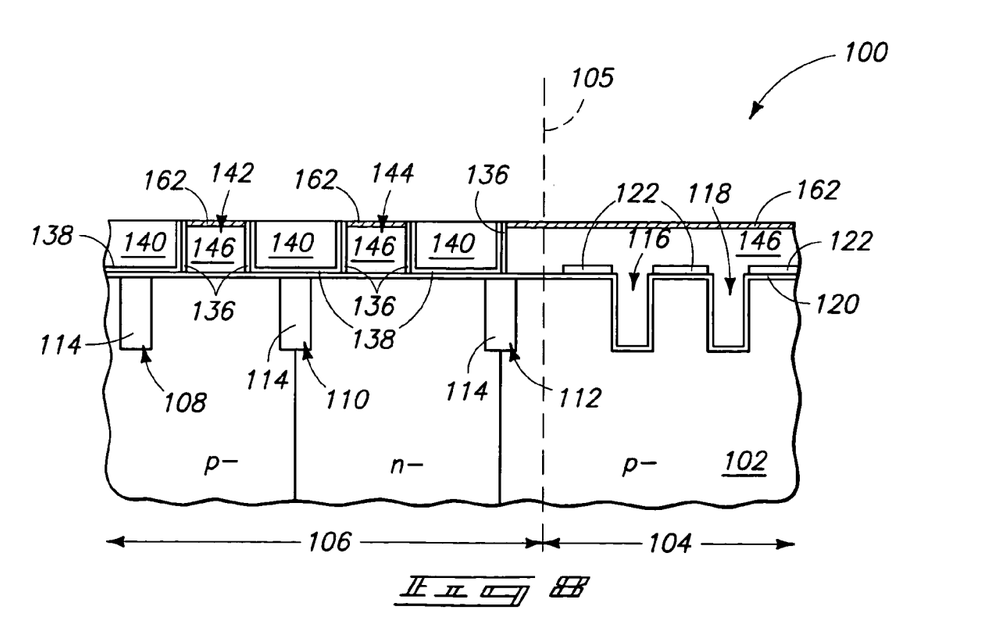

Referring next to FIGS. 7 and 8, construction 100 is illustrated after having been subjected to suitable processing to form metal silicide 162 from reaction of metal of metal-containing layer 160 (FIGS. 5 and 6) with silicon of silicon-containing material 146. The processing can comprise, for example, rapid thermal processing to 450° C., with the temperature of 450° C. being maintained for about 180 seconds. Any excess portions of metal-containing layer 160 (FIGS. 5 and 6) remaining over construction 100 after such processing can be removed by, for example, a wet etch.

Metal silicide 162 can comprise any suitable silicide, and in particular aspects will comprise, consist essentially of, or consist of one or both of nickel silicide and cobalt silicide.

In some aspects of the invention, silicon-containing material within corridors 142 and 144 can be referred to as a first portion of the silicon-containing material, and the silicon-containing material 146 within the access device regions 150, 152 and 154 can be referred to as a second portion of the silicon-containing material. The methodology through FIGS. 7 and 8 has thus simultaneously converted upper regions of the first and second portions of the silicon-containing material to metal silicide. The metal silicide formed from the first portion of the silicon-containing material can be referred to as a first portion of metal silicide, and the metal silicide formed from the second portion of the silicon-containing material can be referred to as a second portion of metal silicide.

The shown conversion of some of silicon-containing material 146 to metal silicide 162 has formed metal silicide only from upper regions of material 146, and has left lower regions of the material 146 unconverted. In particular aspects, less than or equal to a top half of the silicon-containing material within interconnect regions 142 and 144 is converted to metal silicide, and in typical aspects less than or equal to a top third of the silicon-containing material within the line corridors is converted to metal silicide. Preferably, however, at least the top fourth of the silicon-containing material within the gate line corridors will be converted to metal silicide.

The shown aspect of the invention has one of the gate line corridors over a p-region of substrate 102 (the p-region can be referred to as a p-type doped base); and has another gate line corridor 144 over an n-region (or in other words, an n-type doped base). Additionally, the shown aspect of the invention has the memory array region 104 comprising a p-region of the substrate (i.e., a p-type doped base). Silicon-containing material 146 within both of the gate line corridors, as well as within the memory array region, is simultaneously converted to metal silicide 162.

Figure 9:
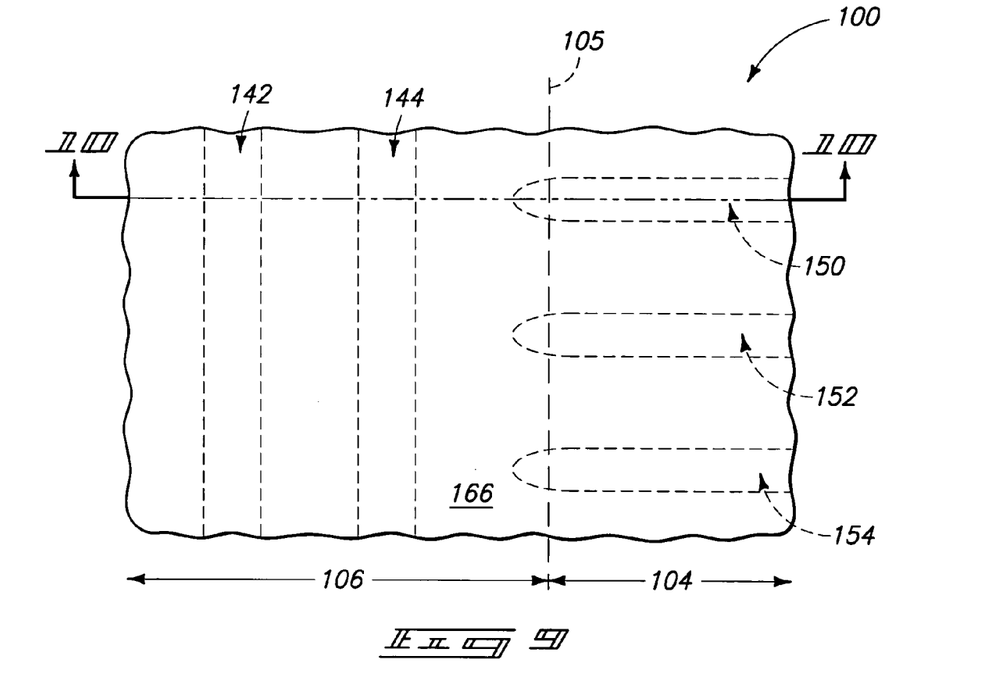
FIGS. 9 and 10 illustrate the fragments of FIGS. 3 and 4, respectively, at a processing stage subsequent to that of FIGS. 7 and 8. The cross-section of FIG. 10 is along the line 10—10 of FIG. 9.
Figure 10:
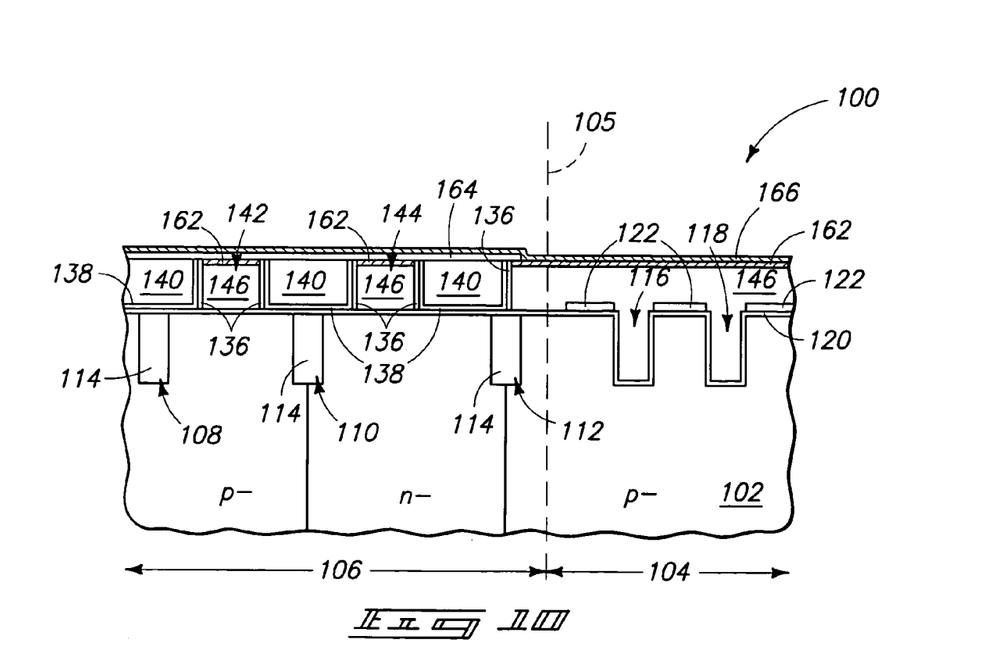

Referring next to FIGS. 9 and 10, a barrier layer 164 is formed over peripheral region 106, and subsequently a second metal-containing layer 166 is formed over the barrier layer, as well as over the metal silicide 162 of memory array region 104. In the shown aspect of the invention, second metal-containing layer 166 is formed directly against the metal silicide 162 of memory array region 104.

Barrier layer 164 is provided to prevent metal from layer 166 interacting with silicon-containing material 146 within the corridors 142 and 144 during a subsequent silicidation reaction occurring in the memory array region (discussed below). The barrier layer can comprise any suitable composition or combination of compositions, and in particular aspects will comprise, consist essentially of, or consist of silicon nitride.

The second metal-containing layer 166 can comprise any composition suitable for silicidation of silicon-containing material 146 of the memory array region 104. In particular aspects, metal-containing material 166 will comprise, consist essentially of, or consist of one or both of cobalt and nickel. Accordingly, in some aspects the second metal-containing layer 166 can have substantially the same composition as the first metal-containing layer 160 (FIGS. 5 and 6). The first and second metal-containing layers can be considered to be substantially the same in composition as one another if the layers are the same in composition within errors of fabrication and detection. The invention also encompasses aspects in which the second metal-containing layer 166 has a composition which is not substantially the same as the composition of the first metal-containing layer 160.

The corridors 142 and 144, and regions 150, 152 and 154 are shown in phantom view in FIG. 9 to illustrate the relationship of FIGS. 9 and 10.

Figure 11:
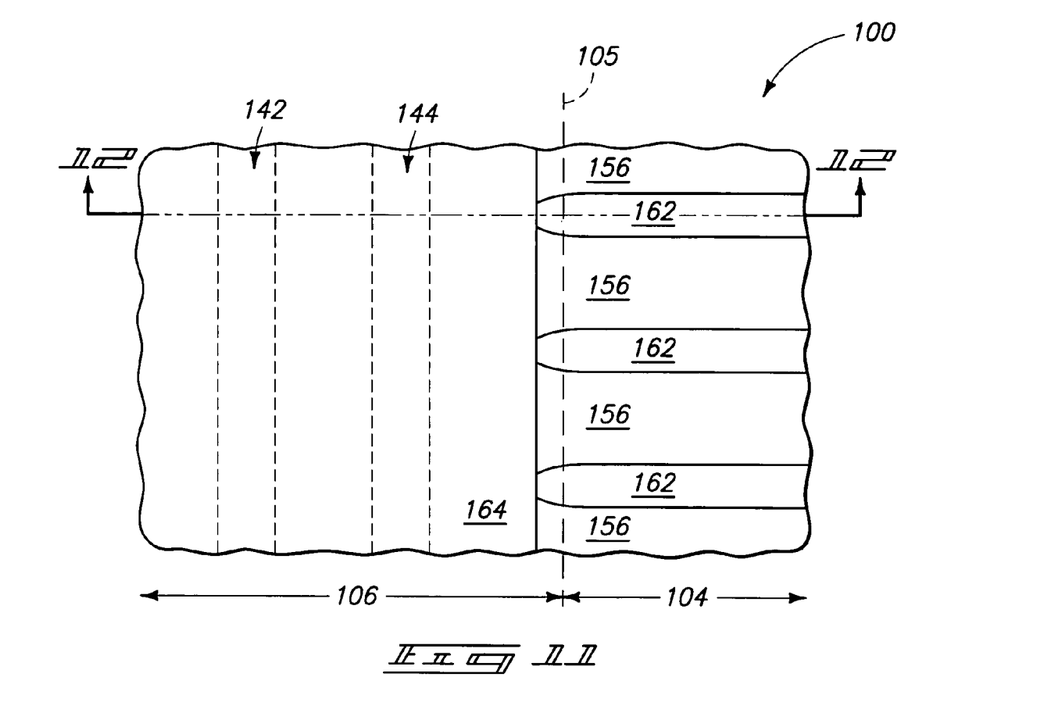
FIGS. 11 and 12 illustrate the fragments of FIGS. 3 and 4, respectively, at a processing stage subsequent to that of FIGS. 9 and 10. The cross-section of FIG. 12 is along the line 12—12 of FIG. 11.
Figure 12:
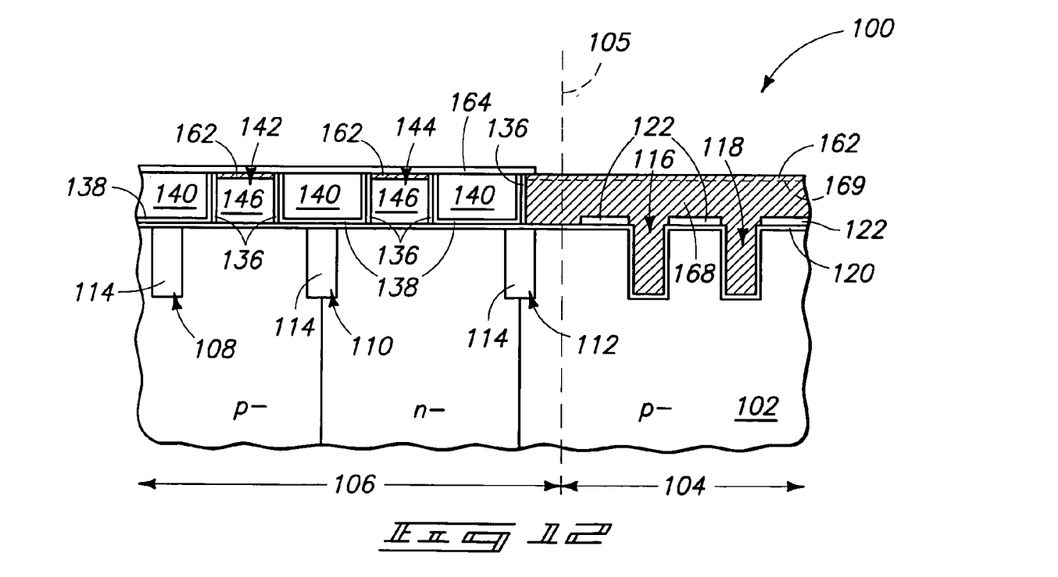

Referring next to FIGS. 11 and 12, metal-containing layer 166 (FIGS. 9 and 10) is utilized to form metal silicide 168 within memory array region 104, and subsequently excess metal of layer 166 is removed. The excess metal can be removed with, for example, a wet etch.

The metal silicide 168 is shown formed below metal silicide 162, with an interface between silicides 162 and 168 being diagrammatically illustrated with the dashed line 169. It is to be understood, however, that silicide 168 would typically be substantially the same in composition as silicide 162 so that the two silicides would merge into a single silicide. Also, even if silicide 168 is different from silicide 162, the two silicides can intermingle within the memory array region so that the suilicides are not distinguishable as being one over the top of the other.

Silicide-containing material 168 can comprise any suitable composition, and in some aspects will comprise, consist essentially of, or consist of one or both of nickel silicide and cobalt silicide.

The processing stage of FIG. 12 shows all of the silicon-containing material 146 of the memory array region converted to metal silicide, which can be a preferred aspect of the invention. Typically, at least some of the silicon-containing material of the memory array will be converted to metal silicide with the second metal-containing layer 166 (FIGS. 9 and 10). The processing utilized to convert at least some of the metal-containing material within the memory array to metal silicide with layer 166 can be identical to that utilized for forming metal silicide with layer 160 of FIGS. 5 and 6. Alternatively, the processing utilized to convert at least some of the metal-containing material within the memory array to metal silicide with layer 166 can be different from that utilized for forming metal silicide with layer 160. In typical aspects, the processing utilized to form metal silicide from layer 166 comprises rapid thermal processing to a temperature of about 800° C., with such temperature being held for a time of about 60 seconds.

The relative thickness of layers 166 (FIGS. 9 and 10) and 160 (FIGS. 5 and 6) can vary depending on the amount of silicon-containing material 146 that is to be converted to metal silicide with such layers. Typically, the layer 166 will be significantly thicker than the layer 160 due to a significantly thicker amount of silicon-containing material 146 ultimately being converted to metal silicide with layer 166 than layer 160. The processing time utilized with the thicker layer 166 can be adjusted to be longer than that utilized with the thinner layer 160.

Figure 13:
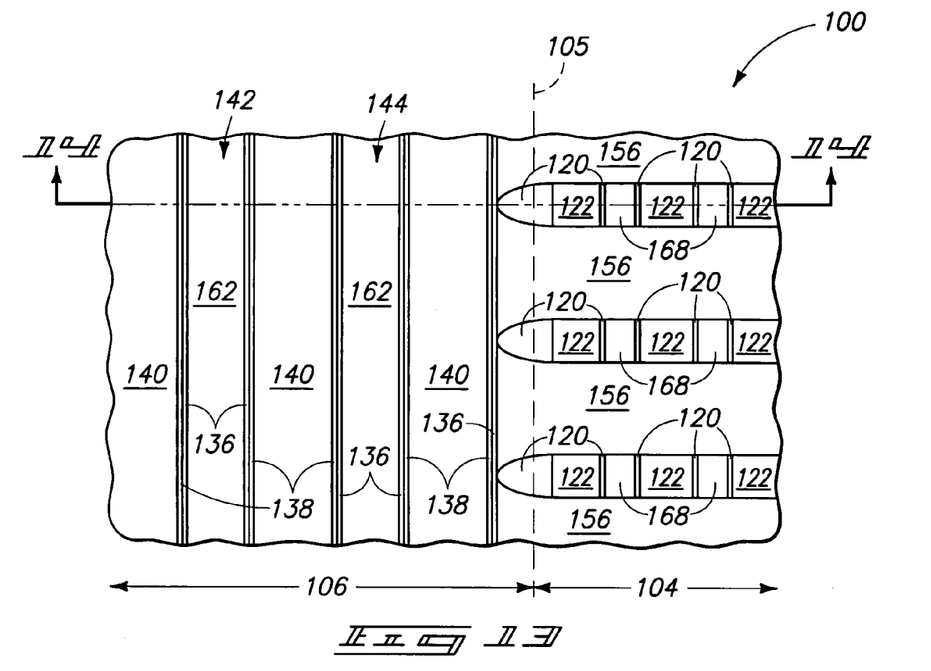
FIGS. 13 and 14 illustrate the fragments of FIGS. 3 and 4, respectively, at a processing stage subsequent to that of FIGS. 11 and 12. The cross-section of FIG. 14 is along the line 14—14 of FIG. 13.
Figure 14:
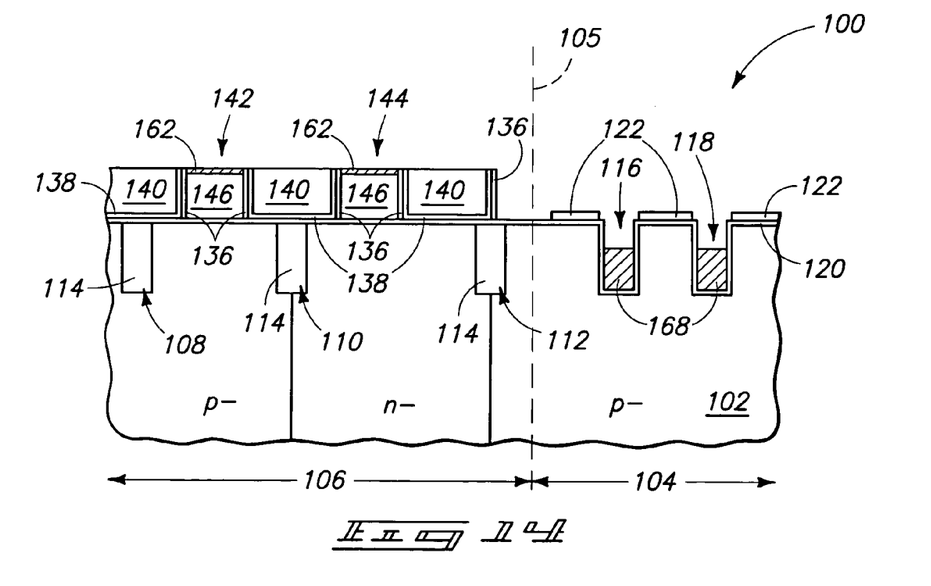

Referring next to FIGS. 13 and 14, the silicide over memory array region 104 is recessed to reduce a level of the silicide to beneath an uppermost elevation of trenches 116 and 118. The recessing of the metal silicide can be accomplished with, for example, a wet etch.

Barrier layer 164 (FIGS. 11 and 12) is removed in progressing from the processing stage of FIGS. 11 and 12 to that of FIGS. 13 and 14. The barrier layer can be utilized as a protective mask to protect silicide of peripheral region 106 during the recessing of the silicide of memory array region 104, and then removed subsequent to such recessing.

Figure 15:
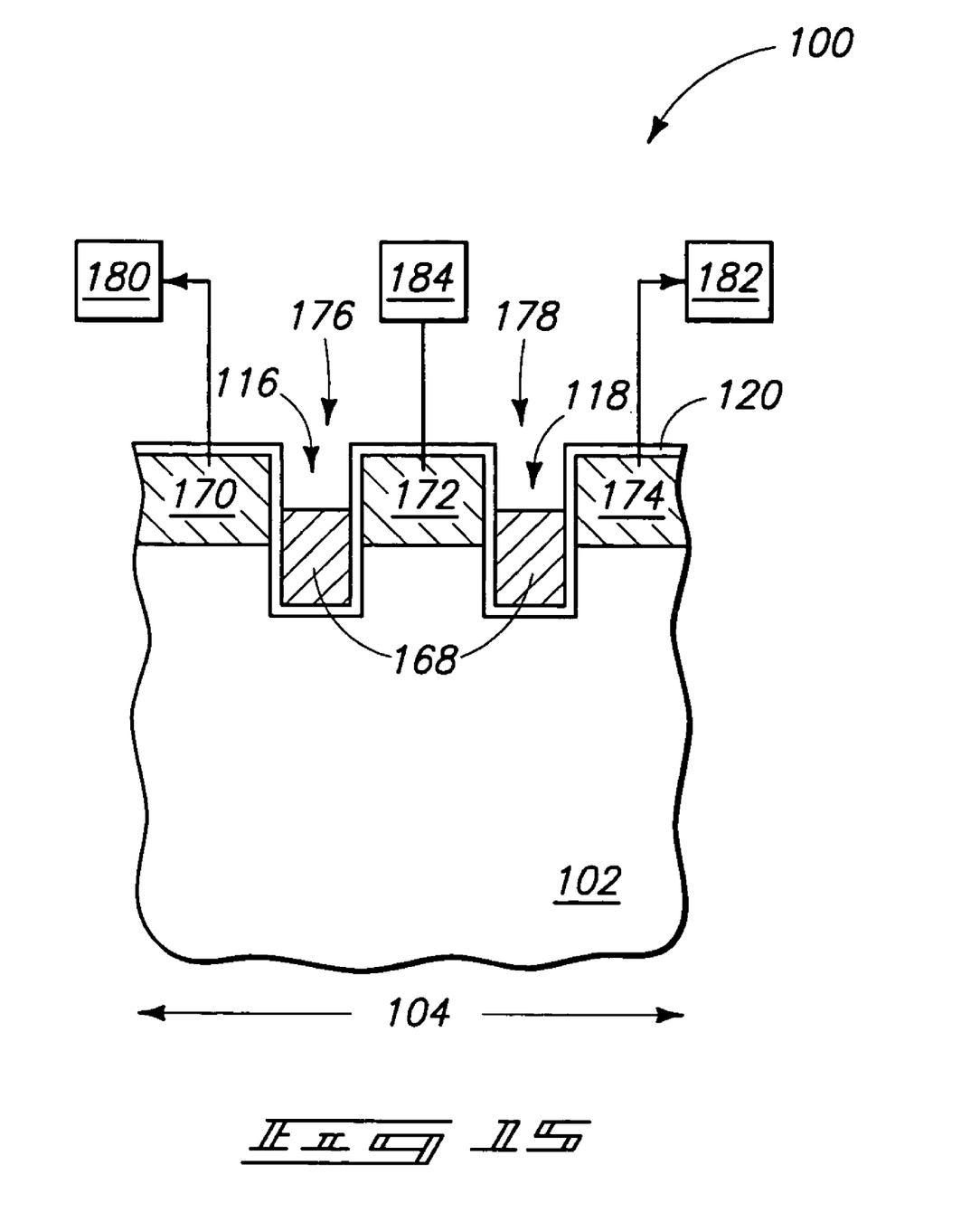
FIG. 15 illustrates a portion of the FIG. 14 fragment shown at a processing stage subsequent to that of FIG. 14.

Referring next to FIG. 15, an expanded portion of memory array region 104 is shown at a processing stage subsequent to that of FIG. 14. Source/drain regions 170, 172 and 174 have been provided proximate the recessed silicide 168. The recessed silicide and source/drain regions together define a pair of transistor devices 176 and 178. Specifically, the device 176 comprises silicide 168 functioning as a transistor gate to interconnect the pair of source/drain regions 170 and 172 with one another; and the device 178 comprises silicide 168 functioning as a transistor gate to interconnect the pair of source/drain regions 172 and 174 with one another.

In particular aspects of the invention, source/drain regions 170 and 174 can be connected to charge storage devices, such as, for example, capacitors 180 and 182, and source/drain region 172 can be connected to a bitline 184. The regions 170 and 174 can be connected to storage nodes of the capacitors, and accordingly can be consider to be storage node contacts. Similarly, the source/drain region 172 can be considered to be a bitline contact.

A dynamic random access memory (DRAM) cell is a charge storage device coupled to a transistor, and DRAM arrays typically comprise charge storage devices coupled through transistors to bitlines, with the transistors being along wordlines extending through the memory array. Accordingly, the FIG. 15 construction can be considered a segment of a DRAM array.

The recessed material 168 within trenches 116 and 118 can fill any appropriate amount of the trenches. Typically it will fill less than two thirds of the volume of the trenches, and in particular aspects will fill from about one fourth of the volume to about one half of the volume of the trenches.

Figure 16:
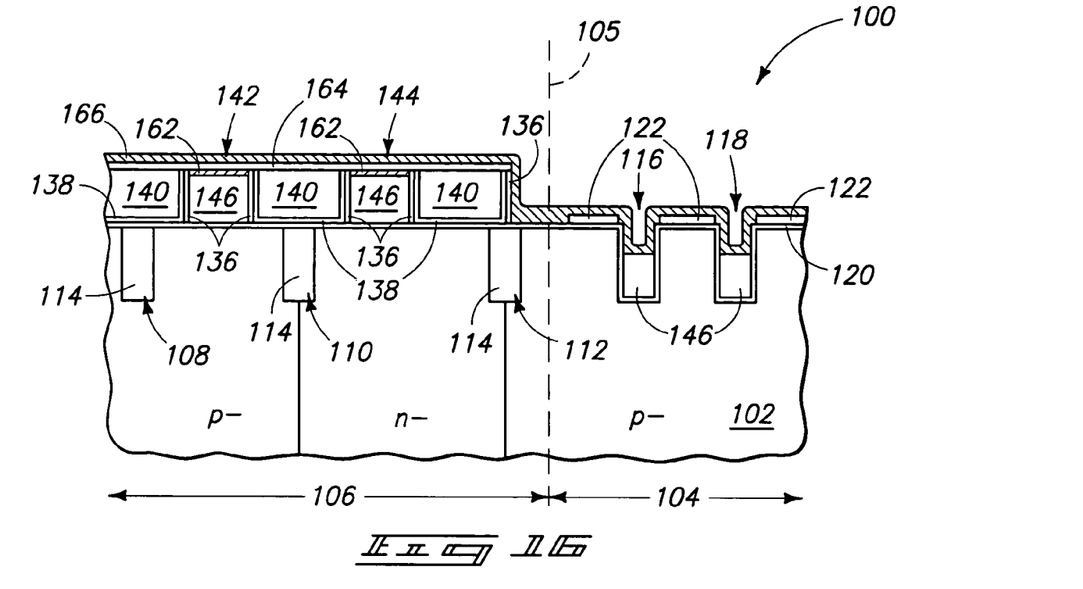
FIG. 16 illustrates the FIG. 4 wafer fragment shown at a processing stage subsequent to that of FIG. 8 in accordance with a second embodiment aspect of the present invention.

Referring next to FIG. 16, construction 100 is illustrated at a processing stage subsequent to that of FIG. 8 in accordance with a second aspect of the invention. Similar numbering will be used in referring to FIG. 16 as was utilized above, where appropriate.

The construction of FIG. 16 is similar to that of FIG. 10, except that metal silicide 162 has been stripped from over memory array region 104, and silicon-containing material 146 has been recessed prior to formation of second metal-containing layer 166. The second metal-containing layer 166 can be utilized identically to the utilization discussed above with reference to FIGS. 9–12 to convert silicon-containing material 146 of the memory array region 104 to silicide.

Figure 17:
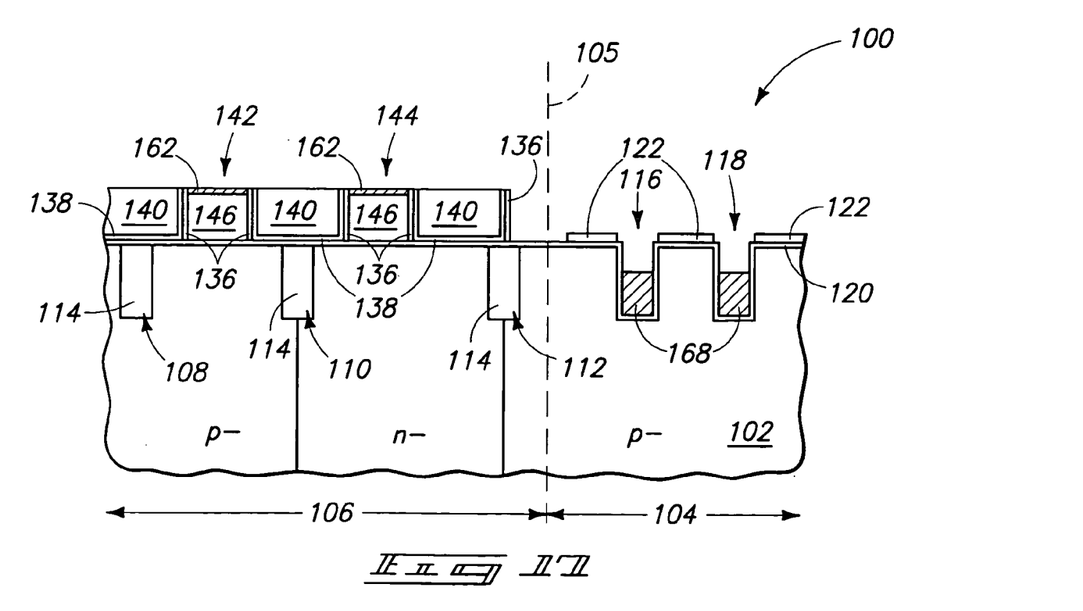
FIG. 17 illustrates the FIG. 4 fragment shown at a processing stage subsequent to that of FIG. 16 in accordance with the second embodiment aspect of the invention.

FIG. 17 shows the construction 100 at a processing stage subsequent to FIG. 16. The metal-containing layer 166 (FIG. 16) has been utilized to convert metal-containing material 146 within trenches 116 and 118 to silicide 168, and then any remaining portion of metal-containing layer 166 has been removed. The construction of FIG. 17 is identical to that of FIG. 14, and accordingly can be subjected to additional processing of the type described above with reference to FIG. 15.

FIGS. 16 and 17 illustrate that the processing to recess materials within trenches 116 and 118 can occur prior to formation of metal-containing layer 166, in contrast to the processing of FIGS. 9–14 in which such recessing occurred after formation of metal-containing layer 166.

Another aspect of the invention is described with reference to FIGS. 18 and 19. In referring to FIGS. 18 and 19, similar numbering will be used as was utilized above.

Figure 18:
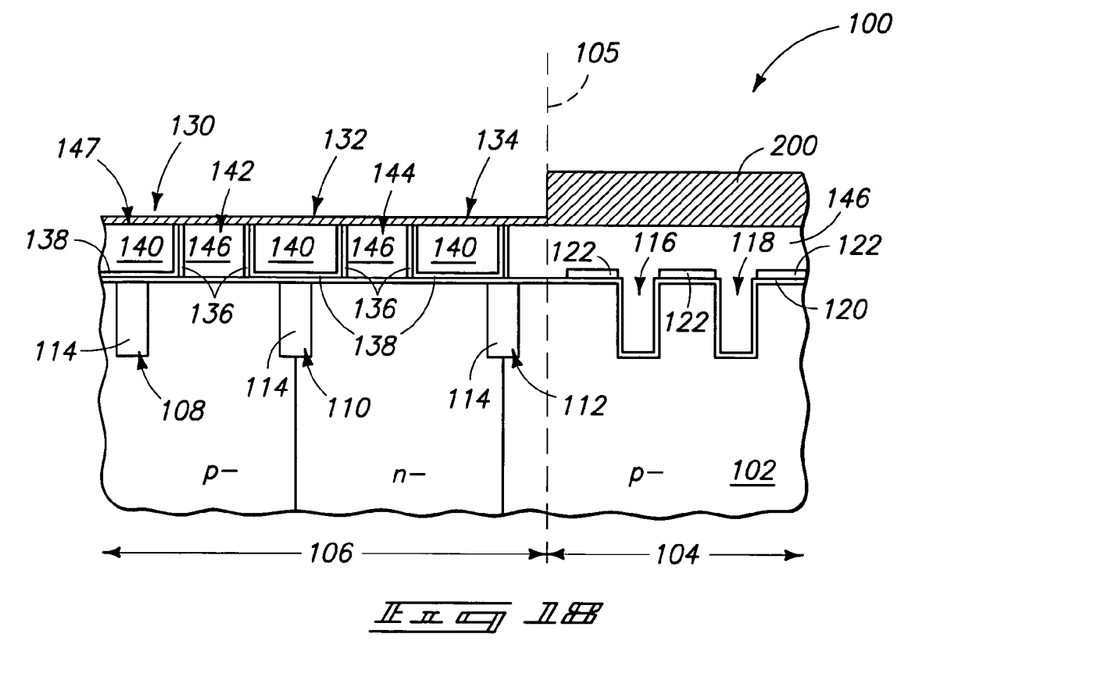
FIG. 18 illustrates the FIG. 4 fragment shown at a processing stage subsequent to that of FIG. 4 in accordance with a third embodiment aspect of the present invention.

FIG. 18 illustrates construction 100 at a processing stage subsequent to that of FIG. 4, and shows a metal-containing layer 200 formed to be thin over peripheral region 106 and thick over memory array region 104. The layer 200 can comprise any suitable composition, and in particular aspects will comprise, consist essentially of, or consist of one or both of nickel and cobalt. The layer 200 can be formed into the shown configuration, by, for example, utilizing selective masking to cover region 106 during some of the deposition of layer 200, but not during all of the deposition of layer 200. The layer 200 can be considered to have a first portion directly over recessed access device trenches 116 and 118, and a second portion directly over gate line corridors 142 and 144. The first portion of layer 200 is substantially thicker than the second portion of such layer, and can be, for example, from about two-times thicker to at least about five-times thicker.

Figure 19:
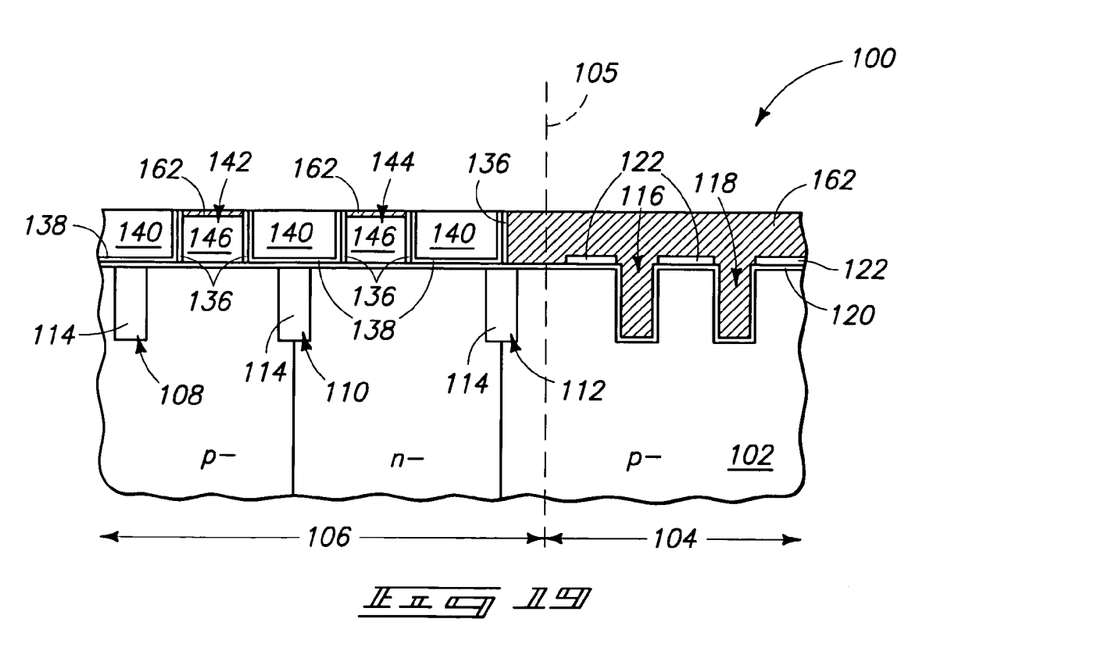
FIG. 19 illustrates the FIG. 4 fragment shown at a processing stage subsequent to that of FIG. 18 in accordance with the third embodiment aspect of the invention.

Referring to FIG. 19, metal from metal-containing layer 200 is utilized to convert silicon-containing material 146 to metal silicide 162. The thinness of layer 200 over corridors 142 and 144 results in formation of silicide from only the upper portions of the silicon-containing material 146 within such corridors; and the thickness of material 200 over memory array region 104 results in conversion of substantially all of the silicon-containing material 146 of such memory array region to silicide.

The construction 100 at the processing stage of FIG. 19 is similar to the construction at the processing stage of FIG. 12, and accordingly can be treated with the processing described previously with reference to FIGS. 11–15 to form silicide transistor gates from the material 162 of the memory array region.

In particular aspects of the embodiment of FIGS. 18 and 19, substantially all, or entirely all of the silicon-containing material within the recessed access device trenches is converted to metal silicide, while less than or equal to an upper half of the silicon-containing material within the gate line corridors is converted to the metal silicide.

Methodology of the present invention can provide a low cost and simple process flow to integrate full metal silicide gates in recessed access devices while integrated partial metal gates in periphery planar transistors. It is advantageous to utilize partially or fully silicide metal gates for high speed chips of memory and logic devices, and accordingly methodology of the present invention can provide a process for fabricating high-speed chips comprising both logic and memory devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming devices associated with a semiconductor construction, comprising:
   providing a semiconductor substrate, the substrate having a memory array region and a peripheral region which is peripheral to the memory array region; the substrate having recessed access device trenches within the memory array region, and having interconnect line corridors within the peripheral region;
   forming silicon-containing material within the recessed access device trenches and within the interconnect line corridors; and
   simultaneously converting some of the silicon-containing material within the interconnect line corridors to a metal silicide and at least some of the silicon-containing material within the recessed access device trenches to the metal silicide.

2. The method of claim 1 wherein the metal silicide comprises one or both of cobalt silicide and nickel silicide.

3. The method of claim 1 wherein the silicon-containing material is conductively-doped prior to said simultaneous conversion of the silicon-containing material.

4. The method of claim 1 wherein the silicon-containing material is not conductively-doped prior to said simultaneous conversion of the silicon-containing material.

5. The method of claim 1 wherein the interconnect line corridors comprise openings extending between insulative material blocks.

6. The method of claim 1 wherein the peripheral region of the substrate comprises a p-doped base and an n-doped base; wherein the memory array region comprises an n-type doped base; wherein a first of the interconnect line corridors is over the n-type doped base of the peripheral region and a second of the interconnect line corridors is over the p-type doped base of the peripheral region; and wherein the converting of some of the silicon-containing material within the interconnect line corridors to the metal silicide converts upper portions of the silicon-containing material within the first and second interconnect line corridors to the metal silicide.

7. The method of claim 6 wherein less than or equal to a top half of the silicon-containing material within the first and second interconnect line corridors is converted to the metal silicide.

8. The method of claim 6 wherein less than or equal to a top third of the silicon-containing material within the first and second interconnect line corridors is converted to the metal silicide.

9. A method of forming devices associated with a semiconductor construction, comprising:
   providing a semiconductor substrate, the substrate having a memory array region and a peripheral region which is peripheral to the memory array region; the substrate having recessed access device trenches within the memory array region, and having gate line corridors within the peripheral region;
   forming silicon-containing material within the recessed access device trenches and within the gate line corridors, the silicon-containing material within the gate line corridors and recessed access device trenches being first and second portions of the silicon-containing material, respectively;
   forming a first metal-containing layer over the first and second portions of the silicon-containing material;
   utilizing metal from the first metal-containing layer to convert upper regions of the first and second portions of the silicon-containing material to first and second portions of a first metal silicide, respectively; the converted upper regions of the first and second portions of the silicon-containing material being over non-converted lower regions of the first and second portions of the silicon-containing material;
   forming a barrier layer over the first portion of the first metal silicide;
   forming a second metal-containing layer over the barrier layer and over the second portion of the first metal silicide; and
   utilizing metal from the second metal-containing layer to convert at least some of the lower region of the second portion of the silicon-containing material to a second metal silicide.

10. The method of claim 9 wherein the first and second metal-containing layers comprise one or both of cobalt and nickel.

11. The method of claim 9 wherein the first and second metal-containing layers are substantially the same in composition as one another.

12. The method of claim 9 wherein the utilization of the metal from the second metal-containing material converts all of the lower region of the second portion of the silicon-containing material to the second metal silicide.

13. The method of claim 9 further comprising recessing the second portion of the silicon-containing material to within the recessed access device trenches prior to the formation of the second metal-containing layer.

14. The method of claim 13 wherein the second metal silicide within the recessed access device trenches is incorporated into transistor gates; the method further comprising forming source/drain regions adjacent the transistor gates, pairs of the source/drain regions being interconnected with one another through individual gates; at least some of the paired source/drain regions comprising a bitline contact and a storage node contact and being incorporated into DRAM devices.

15. The method of claim 9 further comprising recessing the second portion of the silicon-containing material to within the recessed access device trenches subsequent to the formation of the first metal-containing layer and prior to the formation of the second metal-containing layer.

16. The method of claim 9 wherein the first and second portions of the silicon-containing material are substantially coplanar with one another prior to the formation of the first metal-containing layer; and further comprising recessing the second metal silicide within the recessed access device trenches.

17. The method of claim 16 wherein the recessed metal silicide within the recessed access device trenches fills no more than one-half of the volume of the recessed access device trenches.

18. The method of claim 16 wherein the recessed metal silicide within the recessed access device trenches is incorporated into transistor gates; the method further comprising forming source/drain regions adjacent the transistor gates, pairs of the source/drain regions being interconnected with one another through individual gates; at least some of the paired source/drain regions comprising a bitline contact and a storage node contact and being incorporated into DRAM devices.

19. The method of claim 9 wherein the gate line corridors comprise openings extending between insulative material blocks.

20. The method of claim 19 wherein the insulative material blocks comprise silicon dioxide within a silicon nitride liner.

21. The method of claim 9 wherein the peripheral region of the substrate comprises a p-doped base and an n-doped base; wherein a first of the gate line corridors is over the n-type doped base of the peripheral region and a second of the gate line corridors is over the p-type doped base of the peripheral region; and wherein the first metal silicide is formed within both of the first and second gate line corridors.

22. A method of forming devices associated with a semiconductor construction, comprising:
   providing a semiconductor substrate, the substrate having a memory array region and a peripheral region which is peripheral to the memory array region; the substrate having recessed access device trenches within the memory array region, and having gate line corridors within the peripheral region;
   forming silicon-containing material within the recessed access device trenches and within the gate line corridors;
   forming a metal-containing layer over the silicon-containing material, the metal-containing layer having a first portion directly over the recessed access device trenches and having a second portion directly over the gate line corridors; the first portion of the metal-containing layer being substantially thicker than the second portion of the metal-containing layer; and
   utilizing metal from the metal-containing layer to convert silicon-containing material within the gate line corridors to metal silicide and to convert silicon-containing material within the recessed access device trenches to metal silicide.

23. The method of claim 22 wherein the utilization of the metal comprises thermal processing and converts substantially all of the silicon-containing material within the recessed access device trenches to the metal silicide while converting less than or equal to an upper half of the silicon-containing material within the gate line corridors to the metal silicide.

24. The method of claim 23 further comprising removing some of the metal silicide from within the recessed access device trenches to recess the metal silicide within said recessed access device trenches.

25. The method of claim 24 wherein the recessed metal silicide within the recessed access device trenches fills no more than one-half of the volume of the recessed access device trenches.

26. The method of claim 24 wherein the recessed metal silicide within the recessed access device trenches is incorporated into transistor gates; the method further comprising forming source/drain regions adjacent the transistor gates, pairs of the source/drain regions being interconnected with one another through individual gates; at least some of the paired source/drain regions comprising a bitline contact and a storage node contact and being incorporated into DRAM devices.

27. The method of claim 22 wherein the gate line corridors comprise openings extending between insulative material blocks.

28. The method of claim 27 wherein the insulative material blocks comprise silicon dioxide within a silicon nitride liner.

29. The method of claim 22 wherein the peripheral region of the substrate comprises a p-doped base and an n-doped base; wherein a first of the gate line corridors is over the n-type doped base of the peripheral region and a second of the gate line corridors is over the p-type doped base of the peripheral region; and wherein the conversion of the silicon-containing material to metal silicide occurs within both of the first and second gate line corridors.

* * * * *

UNITED STATES PATENT AND TRADEMARK OFFICE
CERTIFICATE OF CORRECTION

PATENT NO. : 7,214,621 B2 Page 1 of 1
APPLICATION NO. : 11/131994
DATED : May 8, 2007
INVENTOR(S) : Nejad et al.

It is certified that error appears in the above-identified patent and that said Letters Patent is hereby corrected as shown below:

On the Title page, item (56), under "U.S. Patent Documents", in column 2, line 7, delete "MdDaniel et al." and insert -- McDaniel et al. --, therefor.

Signed and Sealed this

Eighteenth Day of March, 2008

JON W. DUDAS
*Director of the United States Patent and Trademark Office*